United States Patent [19]

Takatsu

[11] Patent Number: 5,438,284
[45] Date of Patent: Aug. 1, 1995

[54] BASIC LOGIC CIRCUIT HAVING MULTI-EMITTER TRANSISTOR

[75] Inventor: Motomu Takatsu, Kawasaki, Japan
[73] Assignee: Fijitsu Limited, Kanagawa, Japan
[21] Appl. No.: 317,738
[22] Filed: Oct. 4, 1994
[30] Foreign Application Priority Data May 10, 1993 [JP] Japan .................. 5-249606

[51] Int. Cl.[6] .................. H03K 19/20
[52] U.S. Cl. .................. 326/124; 327/480
[58] Field of Search .................. 326/124–130; 327/480

[56] References Cited

U.S. PATENT DOCUMENTS 3,973,141 8/1976 Goldthorp .................. 327/480
4,119,997 10/1978 Fulkerson .................. 327/480
5,281,872 1/1994 Mori .................. 327/480

FOREIGN PATENT DOCUMENTS 4-96274 3/1992 Japan .

Primary Examiner—David R. Hudspeth
Assistant Examiner—Andrew Sanders
Attorney, Agent, or Firm—Armstrong, Westerman Hattori, McLeland & Naughton

[57] ABSTRACT

A basic logic circuit 10 which functions as a data selector consists of a basic circuit 11, a HET (hot electron transistor) 12, the first and second emitters of which are connected to the first emitter of a HET 16 and a data input end A respectively, and an inverter 13 connected to an output end of the circuit 11. In a HET 14 having no base electrode, its collector is connected to a power supply line VCC via a load resistor 15, its first emitter is used exclusively for current output by connecting to the collector of the HET 16 the second emitter of which is connected to a power supply line VSS, its second emitter is used for current input/output by directly connected to a control input end S, and its third emitter is used exclusively for current input by connecting to the first emitter of a HET 17 the second emitter of which is connected to a data input end B. An output data Q is equal to an input data A/B when a control data S is high/low level respectively.

19 Claims, 13 Drawing Sheets

Q1=S·(−A)+(−S)·(−B)

$Q1 = S \cdot A + (-S) \cdot (-B)$

BASIC LOGIC CIRCUIT HAVING MULTI-EMITTER TRANSISTOR

BACKGROUND OF THE INVENTION

The present invention relates to a basic logic circuit having a hot electron transistor (HET), a hot hole transistor, a hetero-junction transistor, a charge induction transistor or the like with multi-emitter.

In order to speed up the operation of a semiconductor integrated circuit, compound semiconductors composed of GaAs, InP, AlGaAs, InGaAsP and the like are used. This increase in speed is also achieved by miniaturizing circuit elements. However, there is a limit to such miniaturization and also, with higher integration, there is a delay caused by wiring in addition to the delay inherent to the circuit elements.

In the attempt to solve this problem, a multi-emitter transistor such as the hot electron transistor (HET) with multi-emitter shown in FIG. 12, has been developed (Japanese First Publication of Patent Application No. Hei4-96274).

A HET is obtained by growing the collector layer 2, the collector barrier layer 3, the base layer 4, the emitter barrier layers 5a to 5c and the emitter layers 6a to 6c on the semi-insulating substrate 1 by using a method such as molecular beam epitaxy (MBE), then vapor depositing the collector electrode 7 on the collector layer 2 and the emitter electrodes 8a, 8b and 8c on the emitter layers 6a, 6b and 6c respectively. For instance, the semi-insulating substrate 1 may be InP, the collector layer 2, the base layer 4 and the emitter layers 6a to 6c may be n-InGaAs, the collector barrier layer 3 may be i-In(AlGa)As, the emitter barrier layers 5a to 5c may be i-InAlAs and the electrodes 7, 8a, 8b and 8c may be Cr/Au.

As shown in FIG. 13A, when the collector electrode 7 of the multiple-emitter type HET is connected to the power supply line VCC via the load resistor 9 and a low or high level potential is imparted to each of the emitter electrodes 8a, 8b and 8c, the operation performed is as described below.

When the emitter electrodes 8a to 8c are at the same level, the potential for a free electron in the HET is as shown in FIG. 13B and the HET is set to OFF, collector electrode 7 being a high level. When the emitter electrodes 8a to 8c are not all at the same level and the potential difference between the high and low level exceeds a threshold level, namely exceeds the sum of the forward turn-on voltage and the reverse turn-on voltage between the emitter and the base, the potential for a free electron in the HET is as shown in FIG. 13C. An electron that has permeated the emitter barrier from the emitter layer of high level due to the tunnel effect becomes a so-called hot electron by its potential energy being converted into kinetic energy in the base layer. Most of the hot electrons run through the thin base layer at high speed to the collector and some of the electrons which are scattered and lost its kinetic energy are pulled through the other emitter barrier to another emitter layer of low level, making the potential of the base layer stable in the state as in FIG. 13C. The HET is turned ON and the collector electrode 7 become to the low level.

Because of this, development of other basic logic circuits with a reduced number of circuit elements and employing a multi-emitter transistor is eagerly awaited.

SUMMARY OF THE INVENTION

Accordingly, an object of the present invention is to provide a basic logic circuit having a relatively small number of circuit elements with a multi-emitter transistor.

In accordance with the present invention, there is provided a basic logic circuit having a control input, a first data input end, a second data input end and a data output end, the circuit comprising: a first transistor having a collector, a first emitter, a second emitter, a third emitter, a base between a collector and each of the three emitters, the base having no electrode, the second emitter being the control input end, the collector being the data output end, a carrier in one of the three emitters being able to move through the base to the collector when a potential difference for the carrier between the one emitter and another emitter of the three emitters is more than a threshold voltage; a first load resistor means connected between the collector and a first power supply line; carrier-source control means, having a first end being connected to the first emitter and having a second end being the first data input end, for admitting/prohibiting to push a carrier in the first emitter to the base by controlling a potential level of the first emitter in response to a potential level of the second end of the carrier-source control means; and carrier-sink control means, having a first end being connected to the third emitter and having a second end being the third data input end, for admitting/prohibiting to pull a carrier in the base to the third emitter by controlling a potential level of the third emitter in response to a potential level of the second end of the carrier-sink control means.

The first transistor is a hot carrier transistor which is either a hot electron transistor or a hot hole transistor, a hetero-junction transistor, a charge induction transistor or the like with multi-emitter each of which functions as a ordinary base or emitter in dependence on potentials thereof. For example, the first transistor is a hot carrier transistor which have emitter barrier between each of the emitter and the base, and a collector barrier between the base and the collector, and have no base electrode, wherein all of the emitters, said base and said collector are one of p-type semiconductor and n-type semiconductor. Another example of the first transistor is a hetero-junction PNP or NPN transistor having no base electrode and having multiple emitters.

In the basic logic circuit according to the present invention, in case of the first transistor being a hot electron transistor, when the control input end is at high level, the level of the data output end depends entirely upon the level of the first data input end and is not affected by the level of the second data input end since the control input works as carrier-sink, and when the control input end is at low level, the level of the data output end depends entirely upon the level of the second data input end and is not affected by the level of the first data input end since the control input works as carrier-source. In case of the first transistor being a hot hole transistor, when the control input end is at high level, the level of the data output end depends entirely upon the level of the second data input end and is not affected by the level of the first data input end, and when the control input end is at low level, the level of the data output end depends entirely upon the level of the first data input end and is not affected by the level of the second data input end.

With the basic logic circuit of the present invention, the various types of logic circuits can be structured with a reduced number of circuit elements compared to the prior art.

For example, as it will be explained in detail in the description of the embodiments, the latch circuit shown in FIG. 2A, the latch circuit shown in FIG. 3A, the master/slave D flip-flop 30 shown in FIG. 4A, the master/slave -JK flip-flop 30A shown in FIG. 5A and the master/slave T flip-flop 30B shown in FIG. 6B can be achieved.

Each of the carrier-source control means and carrier-sink control means is constructed by a hot carrier transistor, an ordinary NPN or PNP transistor or a diode as will be described in the embodiments.

DESCRIPTION OF THE PREFERRED EMBODIMENTS

First embodiment

Figure 1A:
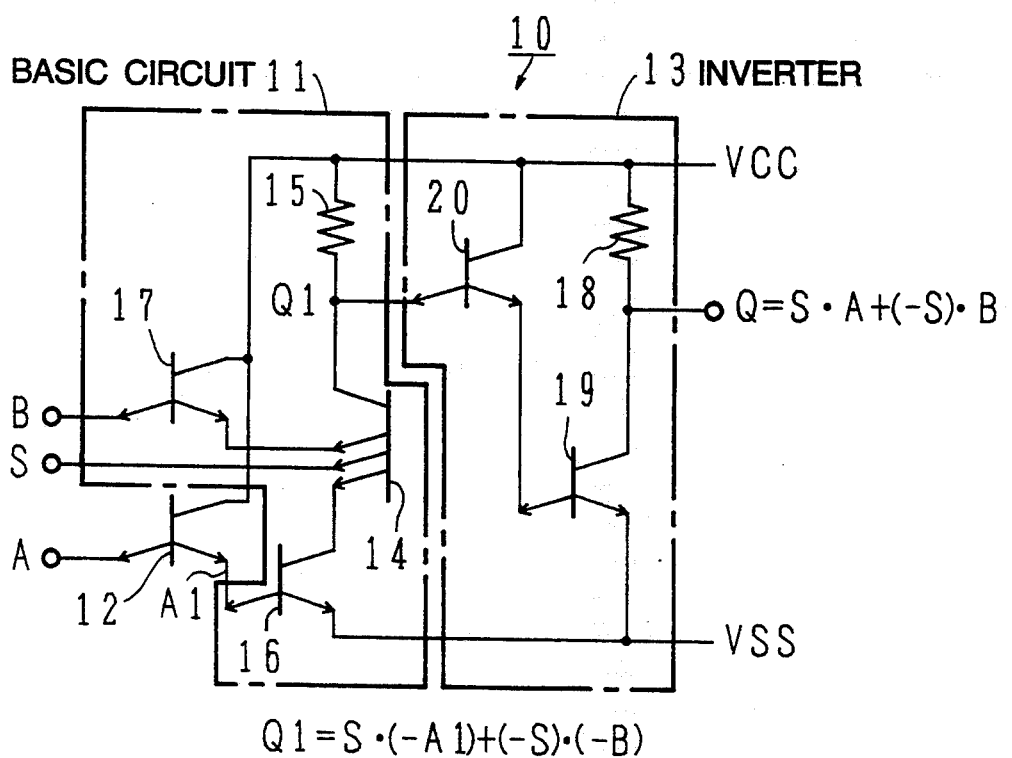
FIG. 1A is a diagram that shows the basic logic circuit having multi-emitter transistor as a data selector in the first embodiment according to the present invention and FIG. 1B is a logic circuit diagram that shows the functions of the circuit shown in FIG. 1A.

FIG. 1A shows the data selector 10 constituted of the basic logic circuit having hot electron transistor (HET) with multi-emitter in the first embodiment. Hereafter, multiple emitters of the hot electron transistors are referred to as the first emitter, the second emitter and so on, from bottom to top and from right to left.

The data selector 10 comprises the basic circuit 11, the HET 12 which is connected to the input end of the basic circuit 11 and the inverter 13 which is connected to the output end of the basic circuit 11.

The basic circuit 11 consists of the HET 14, the load resistor 15, the HET 16 and the HET 17. The collector of the HET 14 is connected to the power supply line VCC via the load resistor 15. Its first emitter is connected to the collector of the HET 16, its second emitter is connected to the control input end S and its third emitter is connected to the first emitter of the HET 17. The first emitter of the HET 16 is connected to the power supply line VSS which potential is lower than that of the power supply line VCC. The second emitter of the HET 17 is connected to the data input end B and its collector is connected to the power supply line VCC. The second emitter electrode of the HET 16 is the data input end A1 and the collector electrode of HET 14 is the data output end Q1.

When connected with the HET 16, the first emitter of the HET 14 is assigned to dedicated use for current output, when connected with the HET 17, the third emitter of the HET 14 is assigned to dedicated use for current input and when the second emitter is directly connected to the control input end S, it is used for both current input and output.

As explained below, the basic circuit 11 functions as a data selector.

When the control input end S is set to high, the ON/OFF state of the HET 14 entirely depends upon the level of the data input end A1 and is not affected by the level of the data input end B since the second emitter of the HET 14 is used for current input. When the data input end A1 is set to high, the HET 16 is turned ON and this turns ON the HET 14 setting the data output end Q1 to low. When the data input end A1 is set to low, the HET 16 is turned OFF which in turn turns OFF the HET 14, setting the data output end Q1 to high.

In contrast, when the control input end S is set to low, the ON/OFF state of the HET 14 depends entirely upon the level of the data input end B and is not affected by the level of the data input end A1 since the second emitter of the HET 14 is used for current output. When the data input end B is set to high, the HET 17 is turned ON, which turns ON the HET 14, setting the data output end Q1 of the basic circuit 11 to low. When the data input end B is set to low, the HET 17 is turned OFF, which turns off the HET 14, setting the data output end Q1 to high.

Therefore, in the basic circuit 11, when the control input end S is at high, the data input end A1 is selected and the inversion of the level of the data input end A1 is output from the data output end Q1. When the control input end S is at low, the data input end B is selected and the inversion of the level of the data input end B is output from the data output end Q1. The boolean expression for the Q1 is expressed as follows:

$$Q1 = S \cdot (-A1) + (-S) \cdot (-B) \quad (1)$$

where, '·' indicates AND, '+' indicates OR, and '−' indicates an inversion of a logical value.

Two problems arise if only the basic circuit 11 is used for the data selector.

The first problem is that the desirable potential for the high level at the data input end B becomes higher than that at the data input end A1. For example, when the power supply line VCC is at 3 V and the power supply line VSS is at 0 V, the desirable potentials of the low levels at the data input end B and the data input end A1 are both approximately 0.5 V and therefore equal, but the desirable potentials of the high levels are approximately 2 V and approximately 1.5 V and are, therefore, different.

In order to solve this problem, the first emitter and the collector of the HET 12 are connected to the second emitter of the HET 16 and the power supply line VCC respectively, so that the second emitter electrode of the HET 12 becomes the data input end A. With this, the ON/OFF state of the HET 12 and that of the HET 16 are interlocked. Also, since the potentials of the collectors of the HET 12 and the HET 17 become the same and, at the same time, the potentials of the two first emitters of those HETs become approximately the same and the threshold potential at the data input end A becomes approximately the same as that of the data input end B.

The other problem is that the low level of the data output end Q1 becomes higher than the desired potential at the low levels of the data input ends A and B. For example, the voltages of the high level and the low level at the data output end Q1 become 3 V and 1.5 V respectively.

This problem can be solved by connecting the inverter 13 to the output end of the basic circuit 11. The inverter 13 consists of the load resistor 18, the HET 19 and the HET 20. The collector of the HET 19 is connected to the data output end Q and to the power supply line VCC via the load resistor 18. The first emitter of the HET 19 is connected to the power supply line VSS and the second emitter is connected to the first emitter of the HET 20. The collector of the HET 20 is connected to the power supply line VCC and its second emitter is connected to the collector of the HET 14.

When the data output end Q1 is at high, the HET 20 and the HET 19 interlock and are turned ON setting the data output end Q to low. In contrast, when the data output end Q1 is at low, the HET 20 and the HET 19 interlock and are turned OFF setting the data output end Q to high. Therefore, the logic of the data output end Q is expressed as follows:

$$Q = S \cdot A + (-S) \cdot B \quad (2)$$

Also, the high level and the low level at the data output end Q can be set, for example, to 2.5 V and 0.5 V respectively.

Figure 1B:
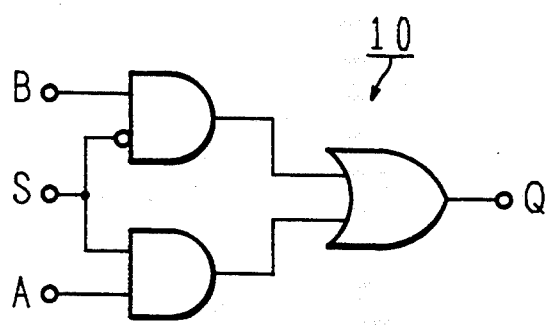

The functions of the data selector 10 shown in FIG. 1A can be indicated with the logic circuit shown in FIG. 1B. Since each of the two-input AND gates and the two-input OR gate is structured with 4 ordinary FETs or 4 ordinary bipolar transistors, a total of 12 ordinary transistors are required to structure the data selector 10 in the prior art. However, the data selector of this first embodiment can be structured with six HETs. Accordingly, the scale of the circuit of the data selector 10 can be reduced to half that of the prior art, thus contributing greatly to higher integration of the semiconductor integrated circuit and also to increasing the speed of its operation.

Examples of application of the data selector 10 in the first embodiment are explained in reference to the following second through sixth embodiments.

Second embodiment

Figure 2A:
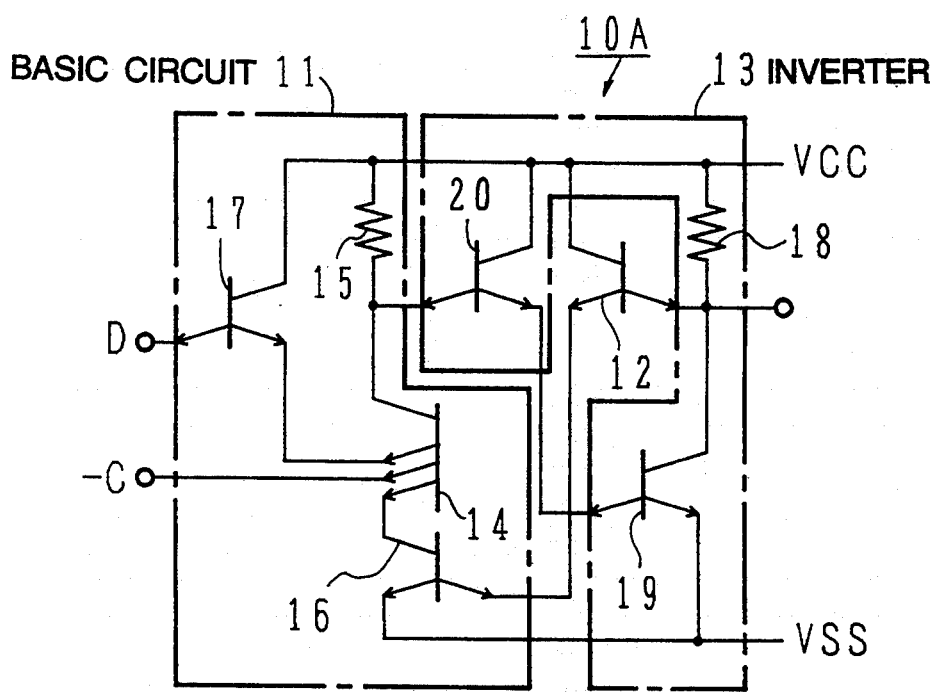
FIG. 2A is a diagram that shows the basic logic circuit having multi-emitter transistor as a latch circuit in the second embodiment according to the present invention and FIG. 2B is a logic circuit diagram that shows the functions of the circuit shown in FIG. 2A.
Figure 2B:
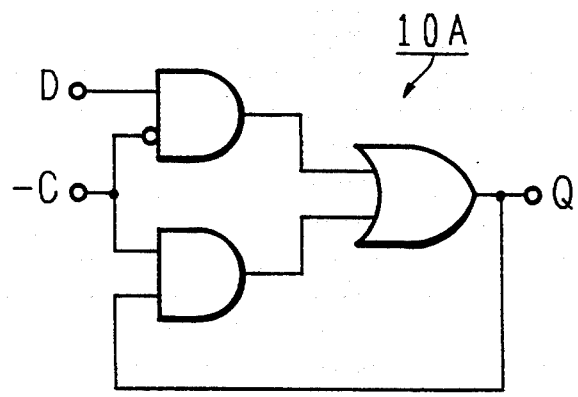

In FIG. 1B, when the data input end A and the data output end Q are connected, the latch circuit 10A as shown in FIG. 2B is achieved. The latch circuit 10A shown in FIG. 2A is constituted by connecting the data output end Q of the data selector 10 shown in FIG. 1A to the data input end A and its functions are indicated in the logic circuit diagram in FIG. 2B.

In the latch circuit 10A, when the clock input end −C is set to '0', Q=D and the operation enters the through mode. Also, when the clock input end C shifts from '0' to '1' in the latch circuit 10A, the logical value at the data output end Q at that point is held and the operation enters the latch mode.

Third embodiment

Figure 3A:
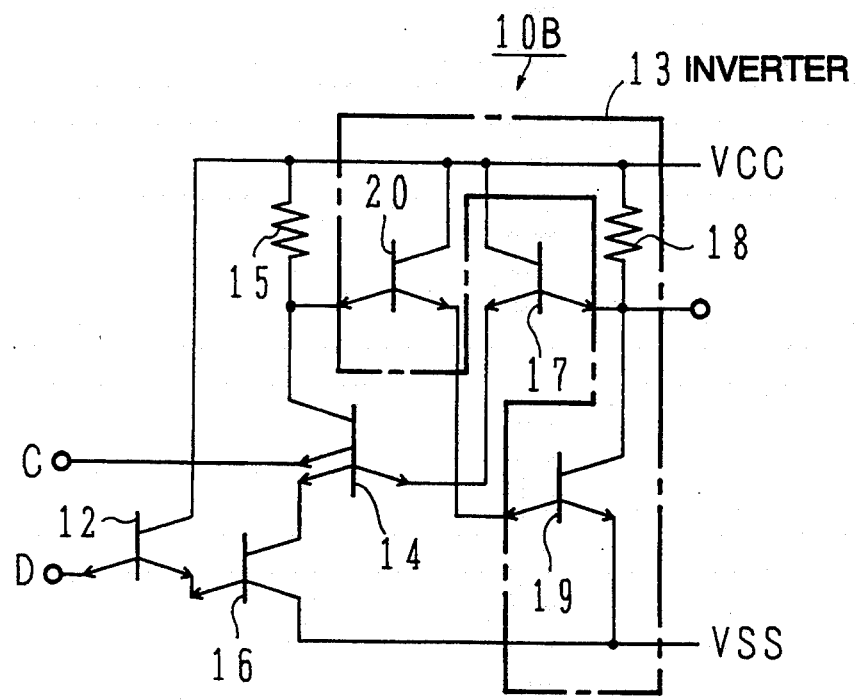
FIG. 3A is a diagram that shows the basic logic circuit having multi-emitter transistor as a latch circuit in the third embodiment according to the present invention and FIG. 3B is a logic circuit diagram that shows the functions of the circuit shown in FIG. 3A.
Figure 3B:
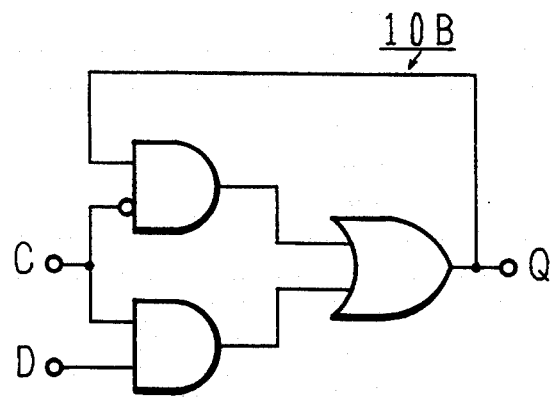

In FIG. 1B, when the data input end B and the data output end Q are connected, the latch circuit 10B shown in FIG. 3B is achieved. The latch circuit 10B shown in FIG. 3B is constituted by connecting the data output end Q of the data selector 10 shown in FIG. 1A to the data input end B and its functions are indicated in the logic circuit in the diagram in FIG. 3B.

In the latch circuit 10B, when C='1', Q=D and the operation enters the through mode. Also, when the clock input end C shifts from '1' to '0', the level of the data output end Q at that point is held and the operation enters the latch mode.

Fourth embodiment

Figure 4A:
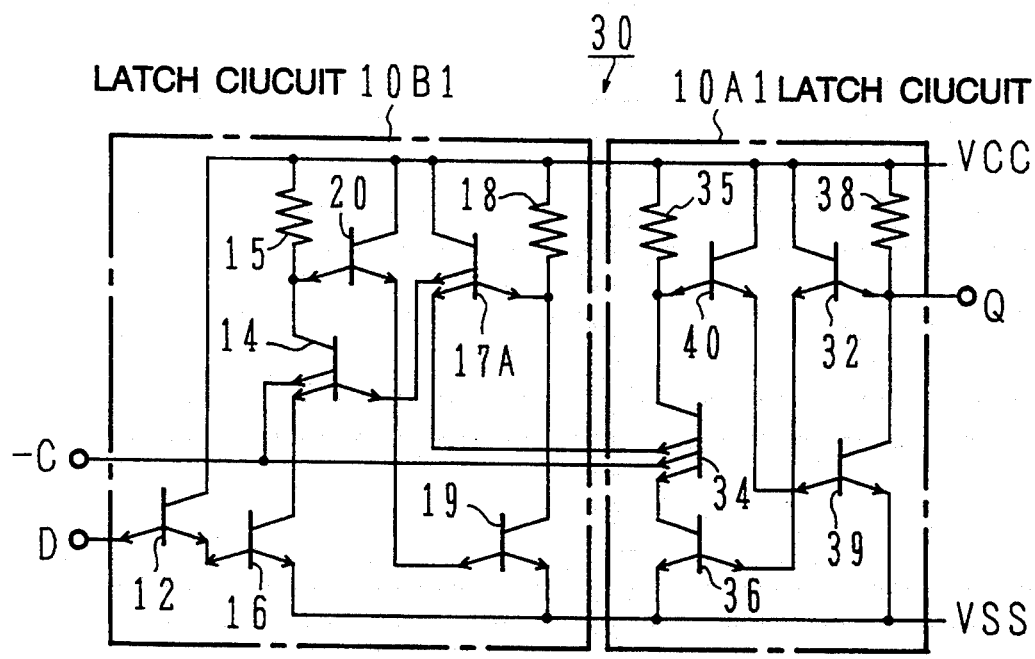
FIG. 4A is a diagram that shows the basic logic circuit having multi-emitter transistor as a master/slave D flip-flop in the fourth embodiment according to the present invention and FIG. 4B is a logic circuit diagram that shows the functions of the circuit shown in FIG. 4A.
Figure 4B:
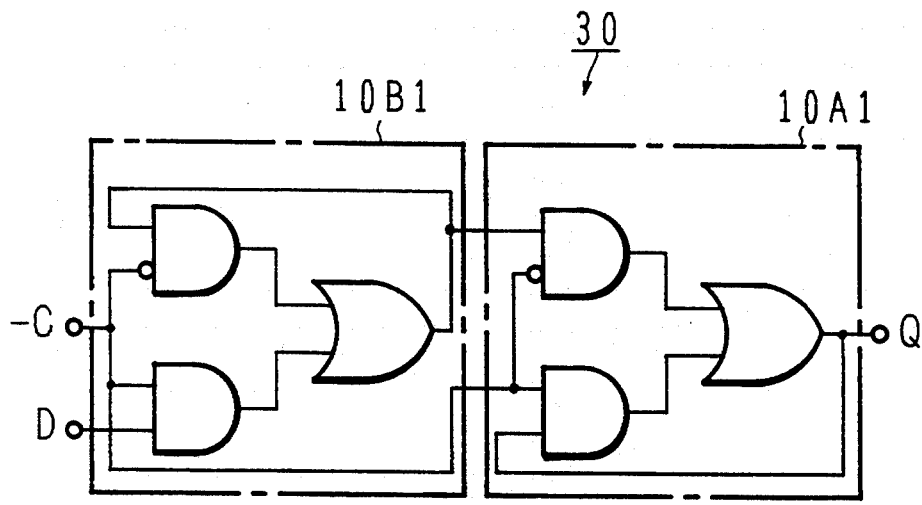

The master/slave D flip-flop 30 shown in FIG. 4B is achieved by connecting the clock input end C and the data output end Q of the latch circuit 10B shown in FIG. 3B to the clock input end −C and the data input end D respectively, of the latch circuit 10A shown in FIG. 2B.

In the D flip-flop 30, the data at the data input end D are held in the first stage latch circuit 10B1 at the timing of the fall of the clock input end −C and the data thus held are output from the data output end Q via the second stage latch circuit 10A1 which is in the through state. Then the output from this latch circuit 10B1 is held in the latch circuit 10A1 at the timing of the rise of the clock input end −C.

As shown in FIG. 4A, the D flip-flop 30 is constituted by cascading the latch circuit 10B1 and the latch circuit 10A1. The latch circuit 10B1 is identical to the latch circuit 10B shown in FIG. 3A except that the two emitter type HET 17 is replaced with a three emitter type HET 17A and the latch circuit 10A1 is identical to the latch circuit 10A shown in FIG. 2A except that the HET 17 is omitted. The components of the latch circuit 10A1 are assigned with reference numbers the same as those of the corresponding components of the latch circuit 10A but with 20 added.

Between the latch circuit 10A1 and the latch circuit 10B1, the third emitter of the HET 14 is directly connected to the second emitter of the HET 34 and the clock input end −C and the second emitter of the HET 17A is directly connected to the third emitter of the HET 34.

In the D flip-flop 30, with the HET 17A being a three emitter type, the HET 17A has additionally the functions of the HET 17 shown in FIG. 2A, simplifying the structure.

When the circuit in which the latch circuit 10A shown in FIG. 2A is assigned to the first stage and the latch circuit 10B shown in FIG. 3A is assigned to the second stage, it functions as a D flip-flop in which the output is held at the rise of the clock.

Fifth embodiment

Figures 5A, 5B:
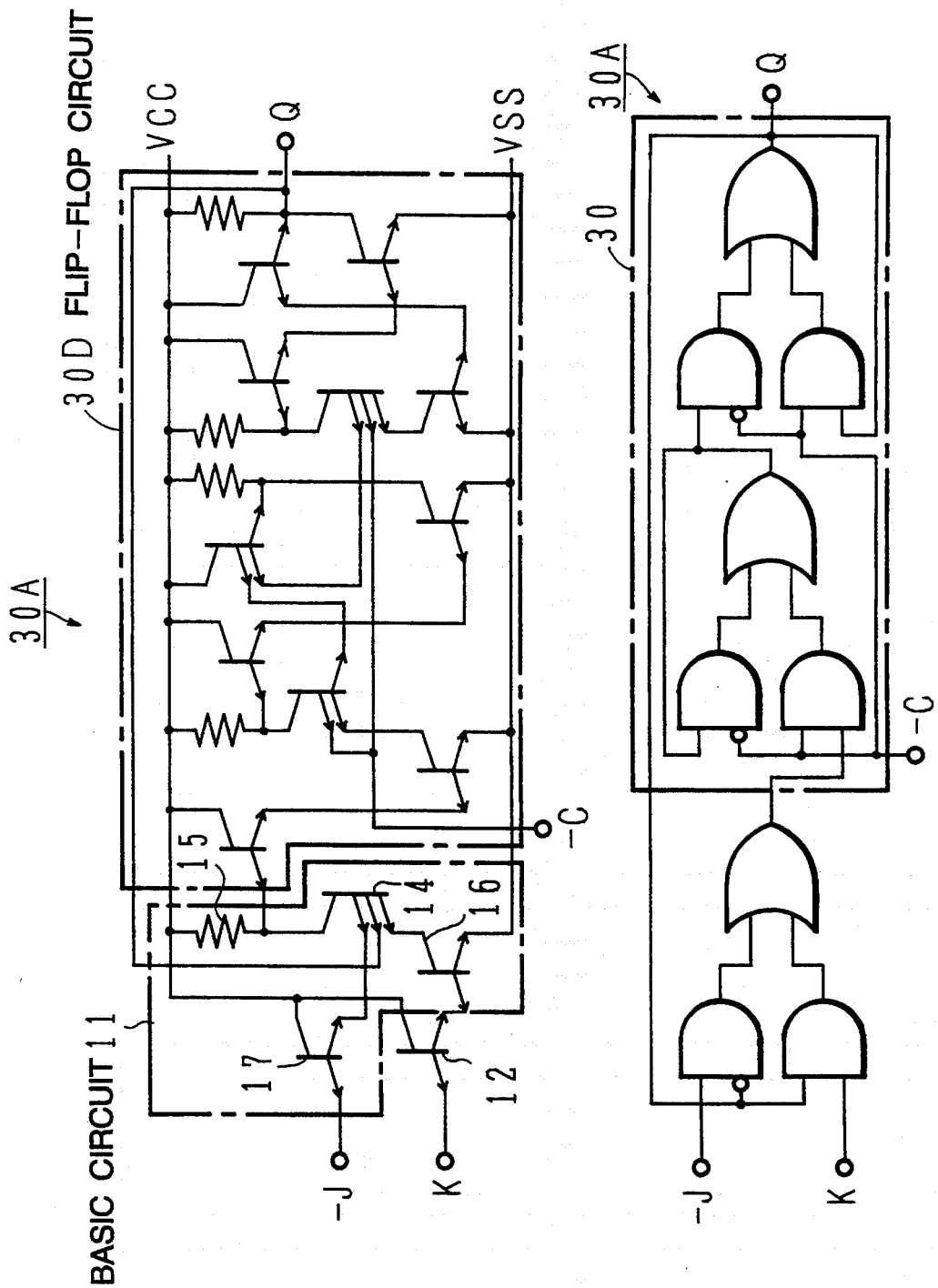
FIG. 5A is a diagram that shows the basic logic circuit having multi-emitter transistor as a master/slave -JK flip-flop in the fifth embodiment according to the present invention and FIG. 5B is a logic circuit diagram that shows the functions of the circuit shown in FIG. 5A.

The master/slave −JK flip-flop 30B shown in FIG. 5B is achieved by connecting the data input end D and the data output end Q of the D flip-flop 30 shown in FIG. 4B to the data output end Q and the control input end S respectively, of the data selector 10 shown in FIG. 1B.

When connecting the D flip-flop 30 shown in FIG. 4A to the output end of the data selector 10 shown in FIG. 1A, the level shift function of the inverter 13 of the data selector 10 can be taken over by the HET 12, the load resistor 15, the HET 14 and the HET 16 of the D flip-flop 30.

Accordingly, the data selector 10 with the inverter 13 removed and the D flip-flop 30 are cascaded to constitute the −JK flip-flop 30A shown in FIG. 5A. With this removal, the structure of the −JK flip-flop 30A is simplified.

Sixth embodiment

Figure 6A:
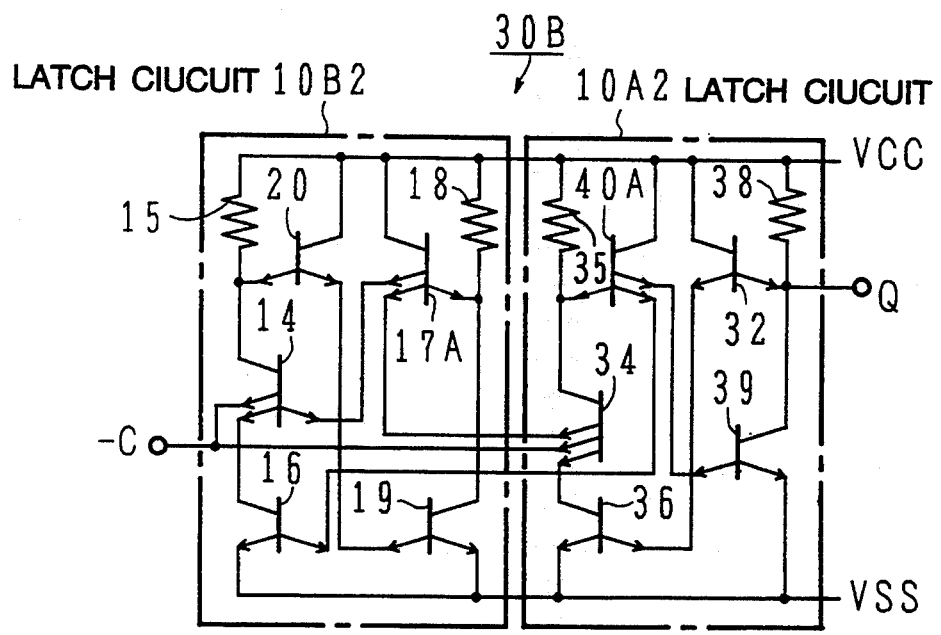
FIG. 6A is a diagram that shows the basic logic circuit having multi-emitter transistor as a T flip-flop in the sixth embodiment according to the present invention and FIG. 6B is a logic circuit diagram that shows the functions of the circuit shown in FIG. 6A.
Figure 6B:
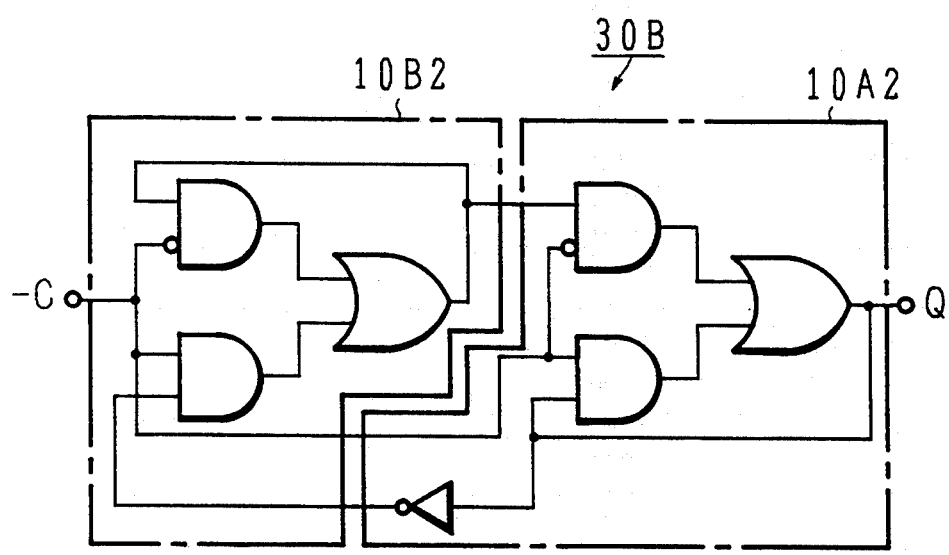

The master/slave T flip-flop 30B shown in FIG. 6B is achieved by connecting the clock input end C and the data output end Q of the latch circuit 10B shown in FIG. 3B to the clock input end −C and the data input end D respectively, of the latch circuit 10A shown in FIG. 2B, and also by connecting the data output end Q of the latch circuit 10A to the data input end D of the latch circuit 10B via the inverter.

In the T flip-flop 30B, the inverted level at the data output end Q is held in the first stage latch circuit 10B2 at the timing of the fall of the clock input end −C. Then the output from this latch circuit 10B2 is held in the latch circuit 10A1 at the timing of the rise of the clock input end −C to take it out from the data output end Q. Consequently, the level of the data output end Q is inverted every time the clock input end −C falls.

As shown in FIG. 6A, the T flip-flop 30B is constituted by cascading the latch circuit 10B2 and the latch circuit 10A2. The latch circuit 10B2 is identical to the latch circuit 10B shown in FIG. 3A except that the HET 12 is removed and the two emitter type HET 17 is replaced with a three emitter type HET 17A. The latch circuit 10A2 is identical to the latch circuit 10A shown in FIG. 2A except that the HET 17 is omitted and the two emitter type HET 20 is replaced with the three emitter type HET 40A. In FIG. 6A, the components of the latch circuit 10A2 are assigned with the reference numbers of the corresponding components of the latch circuit 10A, but with 20 added to them.

Between the latch circuit 10A2 and the latch circuit 10B2, the third emitter of the HET 14 is directly connected to the second emitter of the HET 34 and the clock input end −C and the first emitter of the HET 40A is connected to the first emitter of the HET 16.

In the D flip-flop 30, with the HET 40A being a three emitter type, it takes on the functions of the HET 17 shown in FIG. 2A and those of the inverter shown in FIG. 6B, thus simplifying the structure.

Seventh embodiment

Figure 7A:
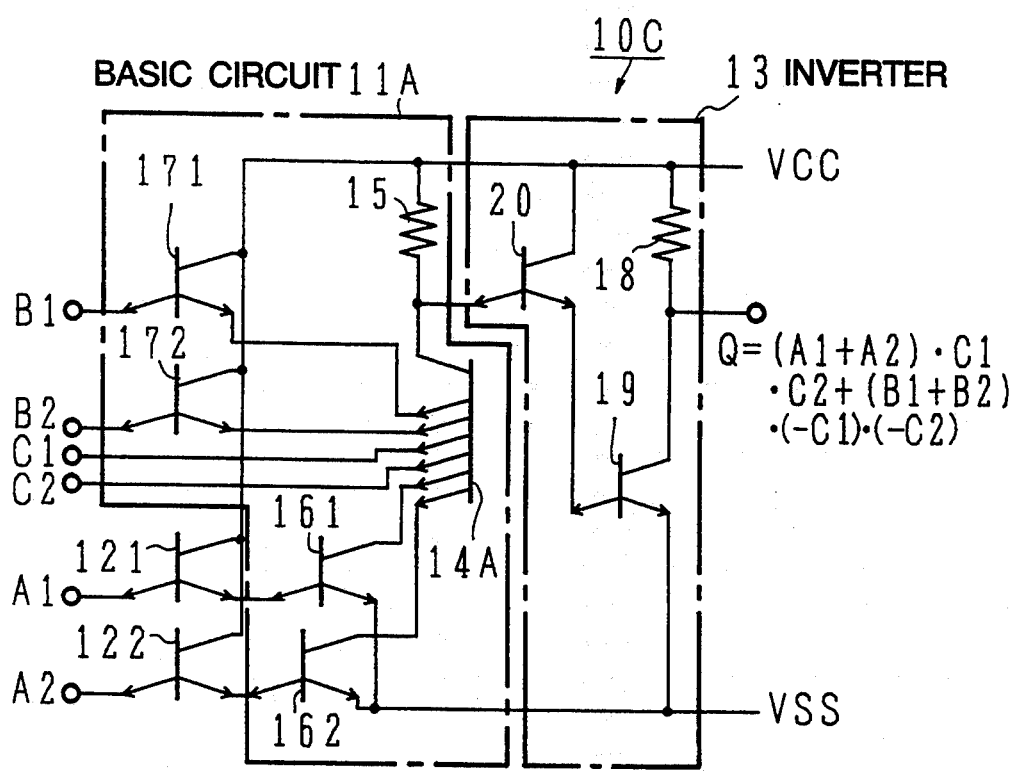
FIG. 7A is a diagram that shows the basic logic circuit having multi-emitter transistor in the seventh embodiment according to the present invention and FIG. 7B is a logic circuit diagram that shows the functions of the circuit shown in FIG. 7A.

FIG. 7A shows the basic logic circuit having hot electron transistor with multi-emitter 10C in the seventh embodiment.

In comparison with the data selector 10 shown in FIG. 1A, in the basic logic circuit 10C, the three emitter type HET 14 is replaced with the six emitter type HET 14A, in place of the HET 16, the two HETs 161 and 162 are used, in place of the HET 17, the two HETs 171 and 172 are used and the control input end S is replaced with the two control input ends C1 and C2. Also, in correspondence with the HETs 161 and 162, the HETs 121 and 122 instead of the HET 12 are used. In other words, the basic logic circuit 10C has a structure in which the data input end A, the control input end S and the data input end B of the data selector 10 are each replaced with its double the data input ends A1 and A2, the control input ends C1 and C2, the data input ends B1 and B2 and the number of emitters of the HET 14A is correspondingly increased.

With this, while the data output end Q of the data selector 10 is expressed with the expression (2) given earlier, the data output end Q of the basic logic circuit 10C is expressed with the following expression in which A in the expression (2) is replaced with A1+A2, B is replaced with B1+B2, S is replaced with C1·C2 and −S is replaced with (−C1)·(−C2), that is;

$$Q=(A1+A2)\cdot C1\cdot C2+(B1+B2)\cdot(-C1)\cdot(-C2) \qquad (3)$$

As is obvious from this expression, when C1=C2='1', the output Q is the OR of the input A1 and the input A2 and is not dependent upon the values of the input B1 and the input B2. When C1=C2='0' the output Q is the OR of the input B1 and the input B2 and is not dependent upon the values of the input A1 and the input A2. When C1≠C2, Q='0' and, therefore, the output Q does not depend upon any of the inputs A1, A2, B1 or B2.

The basic logic circuit 10C can perform more complex selection control and logic operations as the number of emitters in the HET 14A is increased by 3 compared with that of the HET 14 in the data selector 10 shown in FIG. 1A and also by increasing the number of two emitter type HETs by three.

Figure 7B:
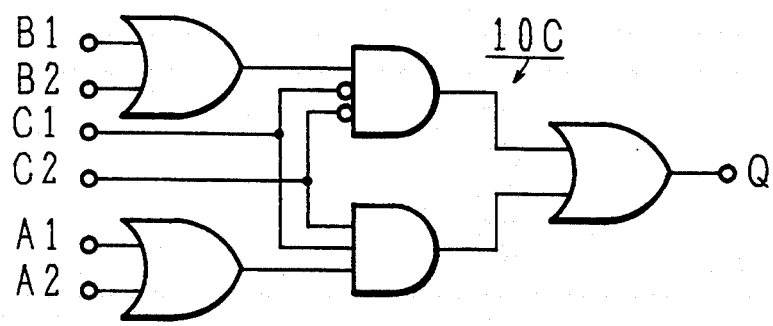

The functions of the basic logic circuit 10C can be indicated in the logic circuit diagram shown in FIG. 7B. Since, in the prior art, each of the two input AND gates and the two input OR gate is structured with 4 ordinary FETs or 4 ordinary bipolar transistors, while each of the three input AND gates and three input OR gates is structured with 6 ordinary FETs or 6 ordinary bipolar transistors, a total 24 ordinary transistors are required to structure the basic logic circuit 10C. However, the basic logic circuit 10C in the seventh embodiment can be structured with 9 HETs. Accordingly, the scale of the basic logic circuit can be reduced to less than half that of the prior art, thus contributing greatly to higher integration of the semiconductor integrated circuit and also to speeding up its operation.

Eighth embodiment

In the basic logic circuit 10C shown in FIG. 7, the OR operations of the input A1 and the input A2 are executed with the two emitters of the HET 14A and the other two emitters of the HET 14A execute the OR operations of the input B1 and the input B2. On the other hand, by connecting between the emitters of the HET 171 and the HET 172, the OR operations of the input B1 and the input B2 are executed by the HET 171 and the HET 172, and by connecting between the emitters of the HET 121 and the HET 122, the OR operations of the input A1 and the input A2 are executed by the HET 121 and the HET 122.

Figure 8:
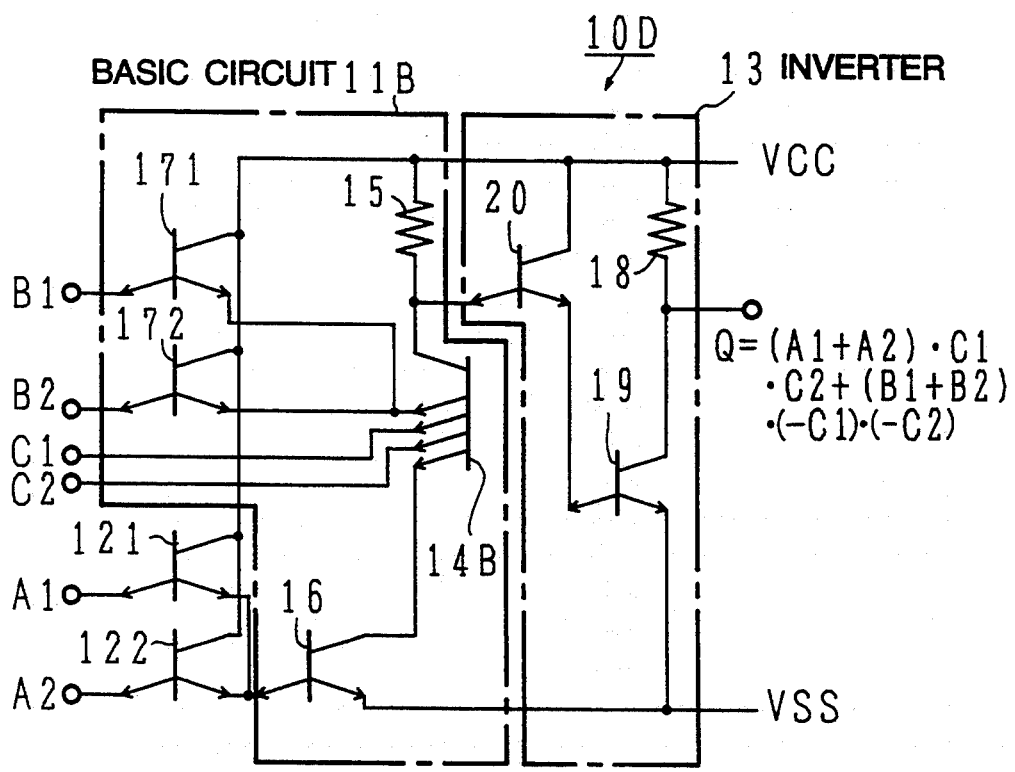
FIG. 8 is a diagram that shows the basic logic circuit having multi-emitter transistor in the eighth embodiment according to the present invention.

Therefore, in the eighth embodiment, the basic logic circuit 10D shown in FIG. 8 is structured in such a manner that it has the identical functions to those of the basic logic circuit 10C shown in FIG. 7 but with a more simplified structure.

In comparison with the basic logic circuit 10C shown in FIG. 7A, the basic logic circuit 10D uses a four emitter type HET 14A instead of the 6 emitter type HET 14A, one HET 16 is used in place of the two HETs 161 and 162, the second emitter of the HET 16 is connected to the two first emitters of the HET 121 and the HET 122 and the fourth emitter of the HET 14A is connected to the two first emitters of the HET 171 and the HET 172.

Compared to the basic logic circuit 10C, the number of transistors in the basic logic circuit 10D is reduced by two and the number of the emitters of the HET 14B is also reduced by two. Thus, the structure of the basic logic circuit 10D is simpler than that of the basic logic circuit 10C.

Ninth embodiment

Figure 9:
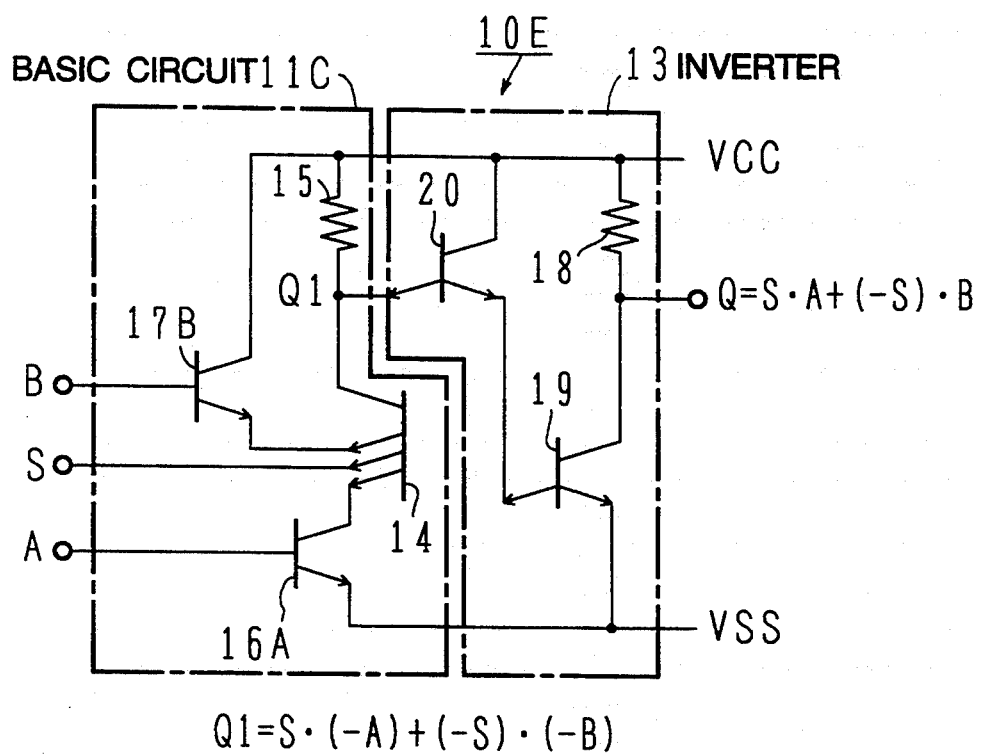
FIG. 9 is a diagram that shows the basic logic circuit having multi-emitter transistor as a data selector in the ninth embodiment according to the present invention.

FIG. 9 shows the data selector 10E which corresponds to that of FIG. 1A. The basic circuit 11C comprises ordinary NPN transistors 16A and 17B instead of hot electron transistors 16 and 17 shown in FIG. 1A, although using only HETs like in FIG. 1A will facilitate production since they can be manufactured in the same process to that for the HET 14. The logic of the data selector 10E is the same as that of the data selector 10 shown in FIG. 1A.

Tenth embodiment

Figure 10:
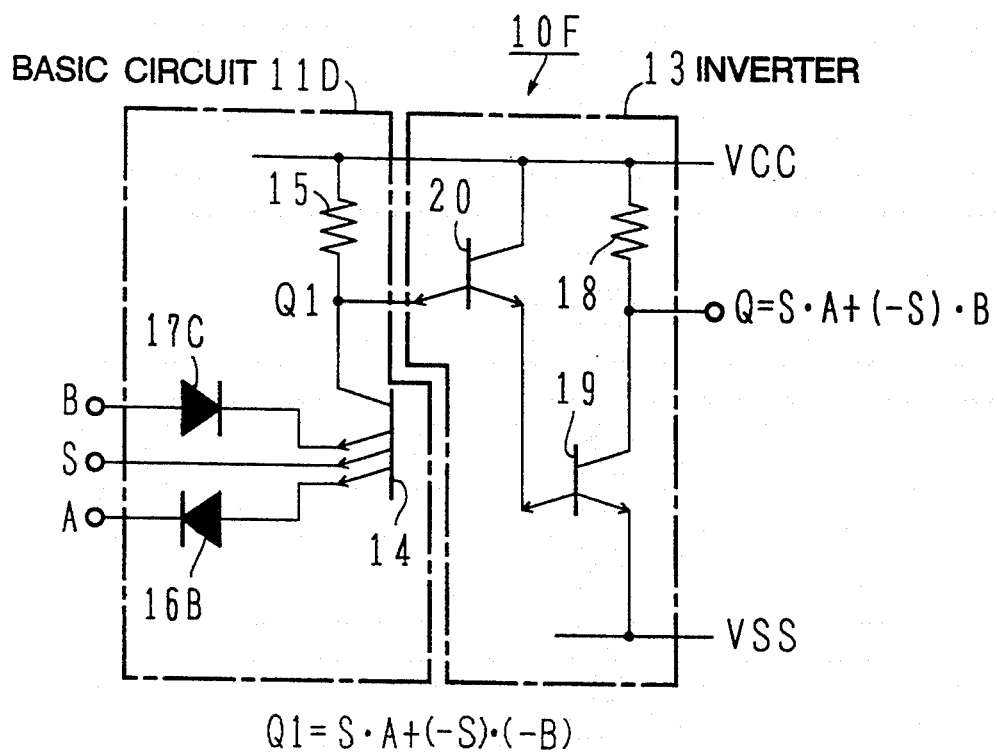
FIG. 10 is a diagram that shows the basic logic circuit having multi-emitter transistor as a data selector in the tenth embodiment according to the present invention.

FIG. 10 shows the data selector 10F which corresponds to that of FIG. 1A. The basic circuit 11D comprises diode 16B and 17C instead of hot electron transistors 16 and 17 shown in FIG. 1A, although using only HETs like in FIG. 1A will facilitate production since they can be manufactured in the same process to that for the HET 14. The logic of the data selector 10F is the same as that of the data selector 10 shown in FIG. 1A.

Eleventh embodiment

Figure 11:
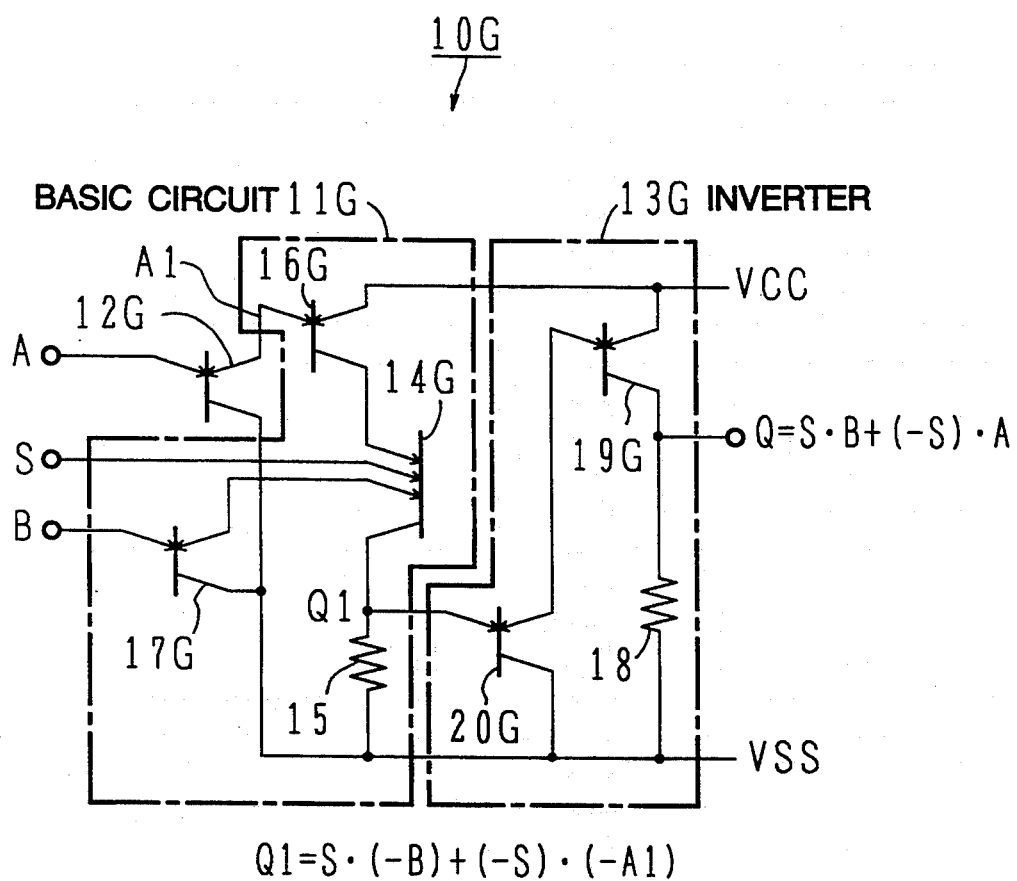
FIG. 11 is a diagram that shows the basic logic circuit having multi-emitter transistor as a data selector in the eleventh embodiment according to the present invention.
Figure 12:
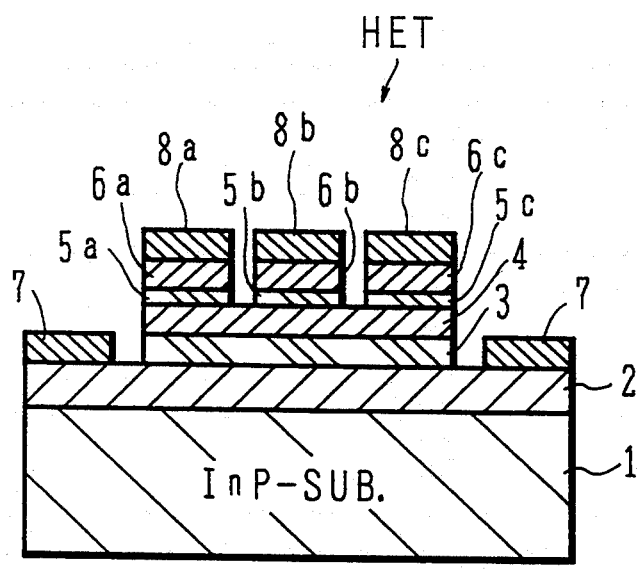
FIG. 12 is a cross sectional view of a hot electron transistor with multi-emitter in the prior art and FIG. 13A is a circuit diagram of an exclusive NOR circuit, in the prior art, that employs hot electron transistor with multi-emitter.
Figure 13A:
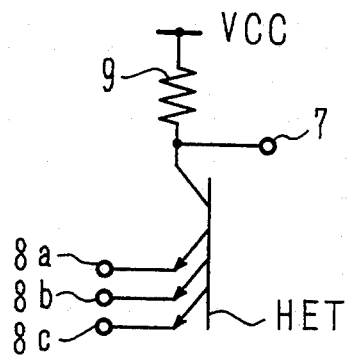
Figure 13B:
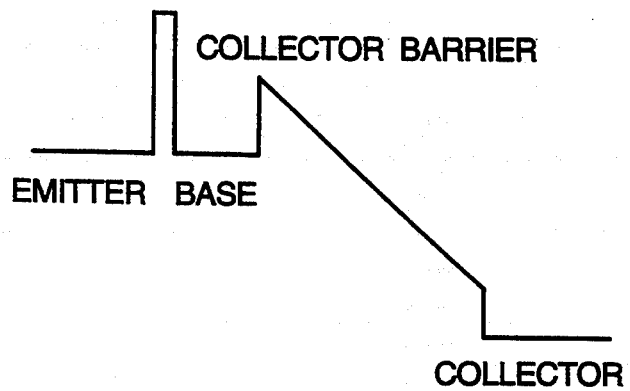
FIG. 13B is a schematic chart that indicates the potential from one emitter through base to collector for a free electron when the logic levels of the three emitters in FIG. 13A are the same and FIG. 13C is a schematic chart that indicates the potential from one emitter through base to collector for a free electron when the logical levels of the three emitters in FIG. 13A are not the same.
Figure 13C:
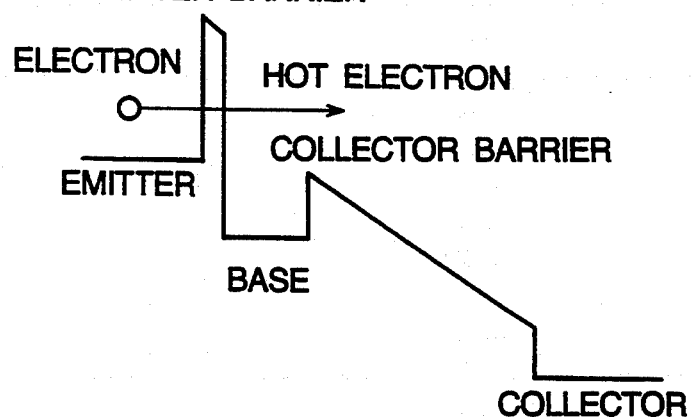

FIG. 11 shows the data selector 10G having basic circuit 11G and inverter 13G, which corresponds to that of FIG. 1A. The data selector 10G is obtained by replacing the hot electron transistors 12, 14, 16, 17, 19 and 20 in FIG. 1A to the hot hole transistors 12G, 14G, 16G, 17G, 19G and 20G respectively, and by exchanging the power supply lines VCC and VSS. All of the collector, base and multiple emitters of the hot hole transistor are of p-type semiconductor.

In this case, when the control input end S is at high level, the level of the data output ends Q1 and Q depends entirely upon the level of the second data input end B and is not affected by the level of the first data input end A, and when the control input end S is at low level, the level of the data output ends Q1 and Q depends entirely upon the level of the first data input end A and is not affected by the level of the second data input end B.

The boolean expression for the Q1 and Q are expressed as follows:

$$Q1 = S \cdot (-B) + (-S) \cdot (-A1) \quad (4)$$

$$Q = S \cdot B + (-S) \cdot A \quad (5).$$

Although the present invention has been described in its preferred embodiments, it is to be understood that the invention is not limited thereto and that various changes and modifications may be made without departing from the spirit and scope of the invention.

For example, the present invention may be structured with other multi-emitter transistor such as a heterojunction PNP or NPN transistor, a charge induction transistor (CHINT) which have more than three source reigns and three drain reigns, or the like each of which emitter functions as a ordinary base or emitter in dependence on potentials thereof as described above. When the multi-emitter transistor is the CHINT, both of the drains and sources correspond to emitters, a channel corresponds to a base and a collector is a collector. As a variation of a hot electron or hole transistor, a resonant tunneling hot electron or hole transistor with double emitter barriers may be used.

Also, in FIG. 11, for example, instead of the hot hole transistors 12G, 16G, 17G, 19G and 20G, ordinary FETs or ordinary bipolar transistors may be used.

What is claimed is:

1. A basic logic circuit having a control input, a first data input end, a second data input end and a data output end, said circuit comprising:

a first transistor having a collector, a first emitter, a second emitter, a third emitter, a base between a collector and each of said three emitters, said base having no electrode, said second emitter being said control input end, said collector being said data output end, a carrier in one of said three emitters being able to move through said base to said collector when a potential difference for said carrier between said one emitter and another emitter of said three emitters is more than a threshold voltage;

a first load resistor means connected between said collector and a first power supply line;

carrier-source control means, having a first end being connected to said first emitter and having a second end being said first data input end, for admitting/prohibiting to push a carrier in said first emitter to said base by controlling a potential level of said first emitter in response to a potential level of said second end of said carrier-source control means; and carrier-sink control means, having a first end being connected to said third emitter and having a second end being said third data input end, for admitting/prohibiting to pull a carrier in said base to said third emitter by controlling a potential level of said third emitter in response to a potential level of said second end of said carrier-sink control means.

2. A basic logic circuit according to claim 1 wherein said first transistor is a first hot electron transistor.

3. A basic logic circuit according to claim 2 wherein said carrier-source control means comprises a second hot electron transistor having a collector which is said first end of said carrier-source control means, having a first emitter connected to a second power supply line, and having a second emitter which is said second end of said carrier-source control means.

4. A basic logic circuit according to claim 1 wherein said carrier-source control means further comprises a third hot electron transistor having a collector connected to said first power supply line, having a first emitter connected to said second emitter of said second hot electron transistor, and having a second emitter which is said second end of said carrier-source control means.

5. A basic logic circuit according to claim 2, wherein said carrier-source control means comprises a NPN transistor having a collector which is said first end of said carrier-source control means, having a emitter connected to a second power supply line, and having a base which is said second end of said carrier-source control means.

6. A basic logic circuit according to claim 2 wherein said carrier-source control means comprises a diode having an anode which is said first end of said carrier-source control means, and having a cathode which is said second end of said carrier-source control means.

7. A basic logic circuit according to claim 2 wherein said carrier-sink control means comprises a fourth hot electron transistor having a collector connected to said first power supply line, having a first emitter which is said first end of said carrier-sink control means, and having a second emitter which is said second end of said carrier-sink control means.

8. A basic logic circuit according to claim 2 wherein said carrier-sink control means comprises a NPN transistor having a collector connected to said first power supply line, having a emitter which is said first end of said carrier-sink control means, and having a base which is said second end of said carrier-sink control means.

9. A basic logic circuit according to claim 2 wherein said carrier-sink control means comprises a diode having an anode which is said first end of said carrier-sink control means, and having a cathode which is said second end of said carrier-sink control means.

10. A basic logic circuit according to claim 2 further comprising:
a fifth hot electron transistor having a collector connected to said first power supply line, having a first emitter, and having a second emitter connected to said collector of said first hot electron transistor;
a sixth hot electron transistor having a collector, having a first emitter connected to said second power supply line, and having a second emitter connected to said first emitter of said fifth hot electron transistor; and
a second load resistor means connected between said first power supply line and said first emitter of said sixth hot electron transistor and collector.

11. A basic logic circuit according to claim 2 wherein a plurality of sets of said control input end and said second emitter of said first hot electron transistor are provided.

12. A basic logic circuit according to claim 2 wherein a plurality of sets of said first data input end, said first emitter of said first hot electron transistor and said carrier-source control means are provided.

13. A basic logic circuit according to claim 2 wherein a plurality of sets of said first data input end and said carrier-source control means are provided and said first ends of said plurality of sets of said carrier-source control means are commonly connected to said first emitter of said first hot electron transistor.

14. A basic logic circuit according to claim 2 wherein a plurality of sets of said second data input end, said third emitter of said first hot electron transistor and said carrier-sink control means are provided.

15. A basic logic circuit according to claim 2 wherein a plurality of sets of said second data input end and said carrier-sink control means are provided and said first ends of said plurality of sets of said carrier-sink control means are commonly connected to said third emitter of said first hot electron transistor.

16. A basic logic circuit according to claim 1, wherein said first transistor is a hot carrier transistor and further comprises:
a first emitter barrier being between said first emitter and said base;
a second emitter barrier being between said second emitter and said base;
a third emitter barrier being between said third emitter and said base; and
a collector barrier being between said base and said collector,
wherein all of said first, second and third emitters, said base and said collector are one of p-type semiconductor and n-type semiconductor.

17. A basic logic circuit according to claim 1 wherein said first transistor is a first hot hole transistor.

18. A basic logic circuit according to claim 17 wherein said carrier-source control means comprises a second hot hole transistor having a collector which is said first end of said carrier-source control means, having a first emitter connected to a second power supply line, and having a second emitter which is said second end of said carrier-source control means.

19. A basic logic circuit according to claim 17 wherein said carrier-source control means further comprises a third hot hole transistor having a collector connected to said first power supply line, having a first emitter connected to said second emitter of said second hot hole transistor, and having a second emitter which is said second end of said carrier-source control means.

* * * * *

UNITED STATES PATENT AND TRADEMARK OFFICE
CERTIFICATE OF CORRECTION

PATENT NO. : 5,438,284
DATED : August 1, 1995
INVENTOR(S) : Motomu Takatus

It is certified that error appears in the above-indentified patent and that said Letters Patent is hereby corrected as shown below:

On the cover page, Item [30], "May 10, 1993" should read --Oct. 5, 1993--.

Signed and Sealed this

Thirty-first Day of October 1995

Attest:

BRUCE LEHMAN

*Attesting Officer*     *Commissioner of Patents and Trademarks*